(12) United States Patent  
Conroy

(10) Patent No.: US 6,606,003 B2  
(45) Date of Patent: Aug. 12, 2003

(54) ERROR COMPENSATING VOLTAGE CONTROLLED OSCILLATOR

(75) Inventor: David G. Conroy, El Granada, CA (US)

(73) Assignee: WebTV Networks, Inc., Mountain View, CA (US)

( * ) Notice: Subject to any disclaimer, the term of this patent is extended or adjusted under 35 U.S.C. 154(b) by 0 days.

(21) Appl. No.: 09/893,018

(22) Filed: Jun. 21, 2001

(65) Prior Publication Data

US 2002/0196087 A1 Dec. 26, 2002

(51) Int. Cl.⁷ .................................................. H03L 7/00
(52) U.S. Cl. ...................... 331/1 A; 327/156; 327/159
(58) Field of Search ................................ 327/147, 150, 327/151, 156, 159, 160; 331/1 A; 348/536, 714; 375/376

(56) References Cited

U.S. PATENT DOCUMENTS

| | | | | | |
|---|---|---|---|---|---|
| 5,982,833 | A | * | 11/1999 | Waters | 375/372 |
| 6,111,471 | A | * | 8/2000 | Bonneau et al. | 331/1 A |
| 6,127,895 | A | * | 10/2000 | Tailor | 327/159 |
| 6,263,684 | B1 | * | 7/2001 | Plante | 62/129 |
| 6,365,982 | B1 | * | 4/2002 | Iles et al. | 290/40 A |
| 6,381,011 | B1 | * | 4/2002 | Nickelsberg et al. | 356/73.1 |

OTHER PUBLICATIONS

M. M. Bemalkhedkar, R. Koul, C.M. Tripathi and M.S. Qureshi Regulated DC Power Supply Employs Digital Control for Firing its SCRs J. Instn Electronics & Telecom. Engrs, vol. 27, No. 6, 1981 pp. 220–221.

Frank Op 't Eynde, Jan Cranickx, Paul Goetschalckx A Fully–Integrated Zero–If DECT Transceiver ISSCC 2000 Paper Continuations,Digest of Technical Papers, ISSCC 2000/Session 8/Wireless Rx/TX/Paper TA 8.1 2000 IEEE International Solid–State Circuits Conference pp. 138, 139 and 450.

S. Kovanas, R. Zilinskas Dynamic Voltage Controlled HF and Microwave Band Oscillator Frequency Stabilizing Method Baltic Electronics Conference, Oct. 7–11, 1996, Tallinn, Estonia, BEC '96 pp. 327 & 328.

Raymond T. Page Constant Reactance Voltage Controlled Oscillator RF design awards Oct. 1990 pp. 76 and Info/Card 39.

David Graef and Joseph Schachner A Versatile and Accurate 300MHZ Time Generation Circuit IEEE Instrumentation and Measurement Technology Conference, May 12–14, 1992 IEEE Catalog No. 92CH3151–8 pp. 233–237.

* cited by examiner

*Primary Examiner*—Terry D. Cunningham
*Assistant Examiner*—Quan Tra
(74) *Attorney, Agent, or Firm*—Workman, Nydegger & Seeley

(57) ABSTRACT

Methods and voltage controlled oscillator designs that compensate for errors. The errors may be caused by variations, from one oscillator to another, in the voltage that produces a nominal frequency and variations in an overall voltage-to-frequency transfer function. A specific control voltage that produces the nominal frequency in a particular voltage controlled oscillator may be determined by comparing a reference frequency count to a variable frequency count for each of one or more control input voltages that are applied to the particular voltage controlled oscillator. The specific control voltage that produces the nominal frequency and other voltages that produce frequencies higher than the nominal frequency and that produce frequencies lower than the nominal frequency may be stored in a table.

33 Claims, 5 Drawing Sheets

ERROR COMPENSATING VOLTAGE CONTROLLED OSCILLATOR

BACKGROUND OF THE INVENTION

1. The Field of the Invention

The present invention relates to variable frequency oscillators. More specifically, the present invention relates to methods and voltage controlled oscillator designs that compensate for errors caused by variations, from one voltage controlled oscillator to another, in the voltage that produces the nominal frequency and in the overall voltage-to-frequency transfer function.

2. Background and Related Art

Voltage controlled oscillators typically produce a nominal frequency at a given voltage. However, it is unlikely that any two randomly selected voltage controlled oscillators will produce the same nominal frequency at the same given voltage. Even though the transfer function of various voltage controlled oscillators may be substantially identical, the given voltage producing the nominal frequency is more likely to vary from one oscillator to another. In general, the operating specifications for voltage controlled oscillators include ranges of values, within expected tolerances. Voltage controlled oscillators with generous tolerances tend to be relatively less expensive, whereas voltage controlled oscillators with strict tolerances tend to be relatively more expensive.

For certain applications, generous tolerances may not present a significant problem because the applications simply do not require a high degree of precision. Other applications, however, may be relatively sensitive to even minor differences in operating characteristics. As suggested above, the traditional design approach for applications demanding a high degree of precision has been to use voltage controlled oscillators with strict tolerances. Not only are voltage controlled oscillators with strict tolerances expensive, but they also tend to be larger than voltage controlled oscillators with more generous tolerances. In part, the larger size is needed to help isolate voltage controlled oscillators with strict tolerances from environmental conditions that may impact the oscillator's performance. For example, highly precise voltage controlled oscillators need to be isolated from changes in temperature.

Fixed oscillators generally do not suffer from the same accuracy problems as voltage controlled oscillators. Using current technology, highly precise fixed oscillators are available at a relatively inexpensive cost. To a large extent, it is the variable frequency aspect of voltage controlled oscillators that leads to precision problems. In spite of the accuracy challenges that variability introduces, voltage controlled oscillators are commonplace in a wide variety of electronic applications. For example, voltage controlled oscillators may be used in processing a digital video signal.

Frames received in a digital video signal usually are placed in a buffer of some sort prior to being displayed. On average, the rate that frames are removed from the buffer should match the rate that frames are added to the buffer; otherwise the buffer will either overflow or underflow. At any particular time, however, the add rate and the remove rate are likely to differ by some small amount. Because the add rate is fixed based on the received digital signal, the remove rate may need to be adjusted periodically. These adjustments to the remove rate should be slight because the color component of a digital video signal can be sensitive to the remove rate. The remove rate may be adjusted by a voltage controlled oscillator. Although the transfer function for most voltage controlled oscillators is relatively predictable, the voltage that produces a particular remove rate is more likely to vary from one oscillator to another.

SUMMARY OF THE INVENTION

The present invention exentends to method and voltage controlled oscillator designs that compensate for errors due to variations, from one voltage controlled oscillator to another, in the voltage that produces the nomial frequency and variations in the overall voltage-to-frequency transfer function. According to the present invenntion, for one or more voltages applied to a voltage controlled osillator, a reference frequency count is compared to a variable frequency count of the variable frequency corresponding to each of the one or more voltages that are applied to the voltage controlled oscillator. These comparisons are stored in a table that is used to determine what voltage should be applied to the voltage controlled oscillator to produce either the nominal frequency or some other frequency of interest. Generating the table may need to occur only during initialization because many voltage controlled oscillators experience little drift. However, the calibration may be repeated at other times to account for any drift that occurs.

Therefore, the present invention provides for calibrating a voltage controlled oscillator to compensate for nominal frequency and/or transfer function errors that may be present due to variations from one oscillator to another, even though the oscillators operate within specified tolerances. By dynamically determining the voltage that produces the oscillator's nominal frequency, the present invention allows inexpensive voltage controlled oscillators having relatively generous tolerances to be used in applications that otherwise may require more precise and expensive voltage controlled oscillators. Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered as limiting its scope, the invention will be described and explained with additional specificity and detail through the use of the accompanying drawings in which.

DETAILED DESCRIPTION OF THE INVENTION

Figure 3A:
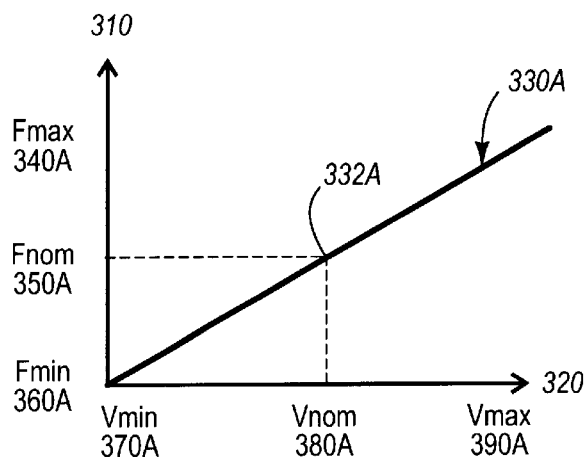
FIGS. 3A–3C illustrate example voltage-to-frequency transfer functions for several voltage controlled oscillators.
Figure 3B:
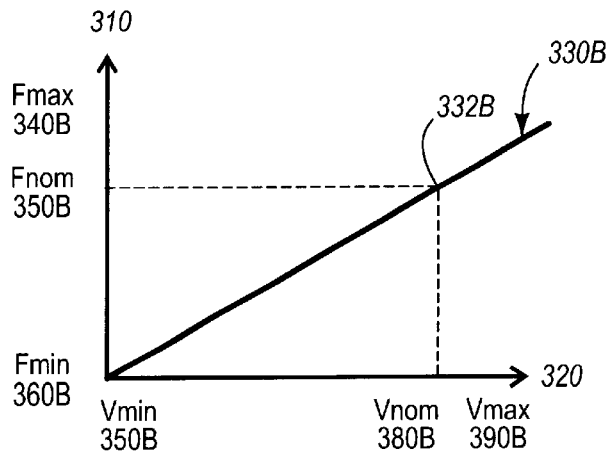
Figure 3C:
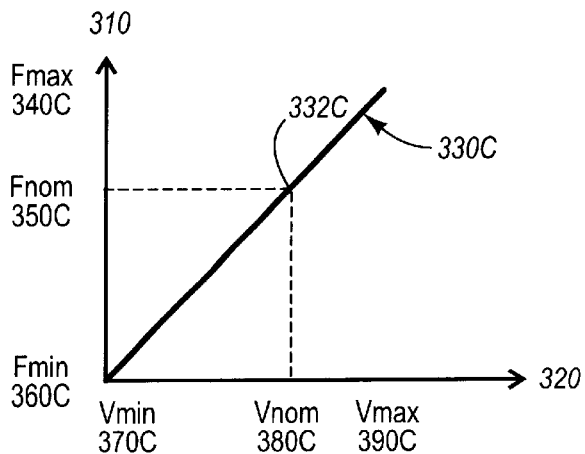

The present invention extends to methods and voltage controlled oscillator designs that compensate for variations in the voltage that produces the nominal frequency of an oscillator, and variations in the overall voltage-to-frequency transfer function, because these characteristics tend to differ from one voltage controlled oscillator to another, as shown in FIGS. 3A–3C. The methods and voltage controlled oscillator designs are described below with respect to digital video processing. Although frequency precision in a variable frequency oscillator is important in processing digital video, the present invention is not limited to any particular environment or application. Those of skill in the art will recognize that dynamic calibration of voltage controlled oscillators, to account for variations between oscillators, including variations within specified tolerances, may be practiced in numerous implementations to meet a wide range of variable frequency needs.

Figure 1:
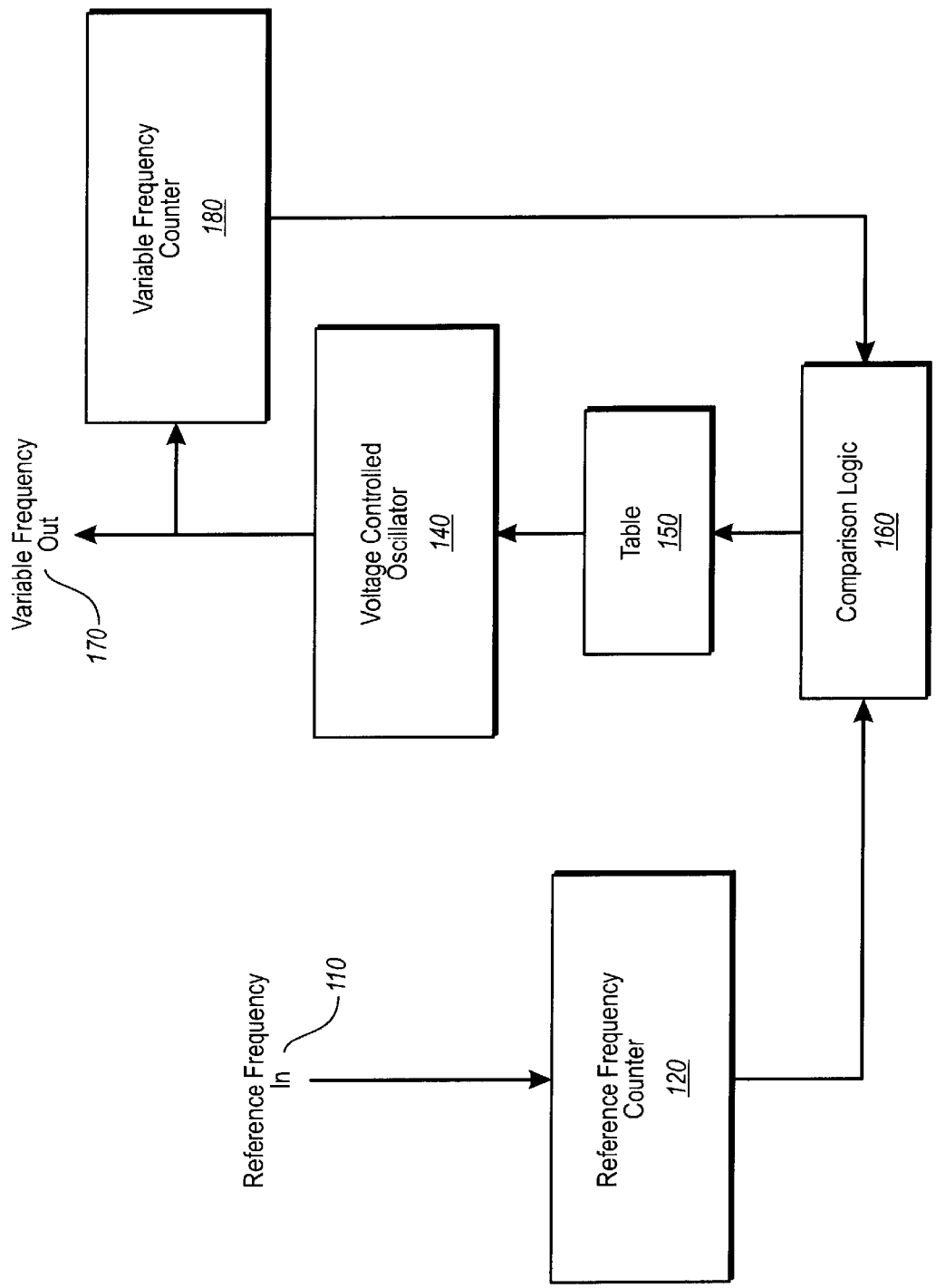
FIG. 1 is a block diagram of a voltage controlled oscillator according to the present invention.

Turning first to FIG. 1, a block diagram of an error compensating voltage controlled oscillator according to the present invention will be described. Voltage controlled oscillator 140 produces a nominal frequency at a given voltage. The given voltage and overall transfer function may vary from one voltage controlled oscillator to another. Variations between voltage controlled oscillators generally are expected, particularly in relatively inexpensive voltage controlled oscillators. However, the variations ordinarily fall within specified tolerances of the nominal frequency.

As used in this application, nominal frequency should be interpreted broadly to encompass a range of frequencies that is appropriate for a particular application that practices the present invention. Therefore, it is not necessary for a voltage controlled oscillator to produce an exact frequency, but rather, the voltage controlled oscillator may need only produce a frequency that is sufficiently close to or within a particular tolerance of an exact frequency. As previously noted, what qualifies as an acceptable tolerance or as sufficiently close will likely depend on the purpose for which a voltage controlled oscillator according to the present invention is used. For example, an application may require an exact frequency, a range of a several Hz, a range of a several parts per million, a range of several percent, or allow for wider range.

Reference frequency counter 120 counts reference frequency 110. Reference frequency 110 may be any reference frequency, including a reference frequency received from a satellite, a reference oscillator, or a computer network. The actual value of reference frequency 110 is not crucial, but best results are achieved when reference frequency 110 is stable. In general, high stability allows better error compensation than is possible with a relatively unstable reference frequency. Reference frequency counter 120 provides one example of reference count means for providing a reference frequency count. Reference frequency 110 in combination with reference frequency counter 120 provide another example of reference frequency means.

Variable frequency counter 180 counts the variable frequency 170 produced by voltage controlled oscillator 140. Variable frequency counter 180 is one example of variable frequency count means for providing a frequency count of a variable frequency. Variable frequency 170 depends on the voltage that is applied to voltage controlled oscillator 140. For one specific voltage, voltage controlled oscillator 140 produces a nominal frequency. Applying other voltages produces higher frequencies or lower frequencies. The range of frequencies available is an operating specification and depends on the voltage controlled oscillator chosen for a particular application. However, the operating specifications for voltage controlled oscillators typically include a tolerance of some amount. As a result, two or more voltage controlled oscillators with the same operating specifications, may produce the nominal frequency at different specific voltages. In other words, the same voltage may not produce the same frequency in all voltage controlled oscillators having the same operating specifications. Voltage controlled oscillator 140 is one example of selected variable frequency means for producing any frequency within a range of frequencies in response to a control input voltage.

Comparison logic 160 compares the variable frequency count in variable frequency counter 180 to the reference frequency count in reference frequency counter 120 to calculate the variable frequency 170 for a given one or more control input voltages. For example, if reference frequency counter 120 counts one hundred and variable frequency counter 180 counts seventy-five during the same time period, then variable frequency 170 is 75% (¾) of the reference frequency 110. Multiplying the reference frequency by the ratio of the variable frequency count to the reference frequency count yields variable frequency 170. In this example, if the reference frequency 110 were 100 MHz, then the variable frequency 170 would be 75 MHz. The foregoing example is merely one of a variety of calculations that may be performed to find variable frequency 170.

When variable frequency 170 is the nominal frequency of voltage controlled oscillator 140, the specific voltage producing the nominal frequency is stored in table 150. Then, the specific voltage may be used to produce the nominal frequency. As described above, the specific voltage that produces the nominal frequency may vary from one voltage controlled oscillator to another. Storing the specific voltage producing the nominal frequency for a specific voltage controlled oscillator 140 allows for a highly precise and accurate variable frequency, using a relatively inexpensive voltage controlled oscillator. Comparison logic 160 is one example of comparison means for identifying a specific one of one or more control input voltages that produces the nominal output frequency.

Figure 2:
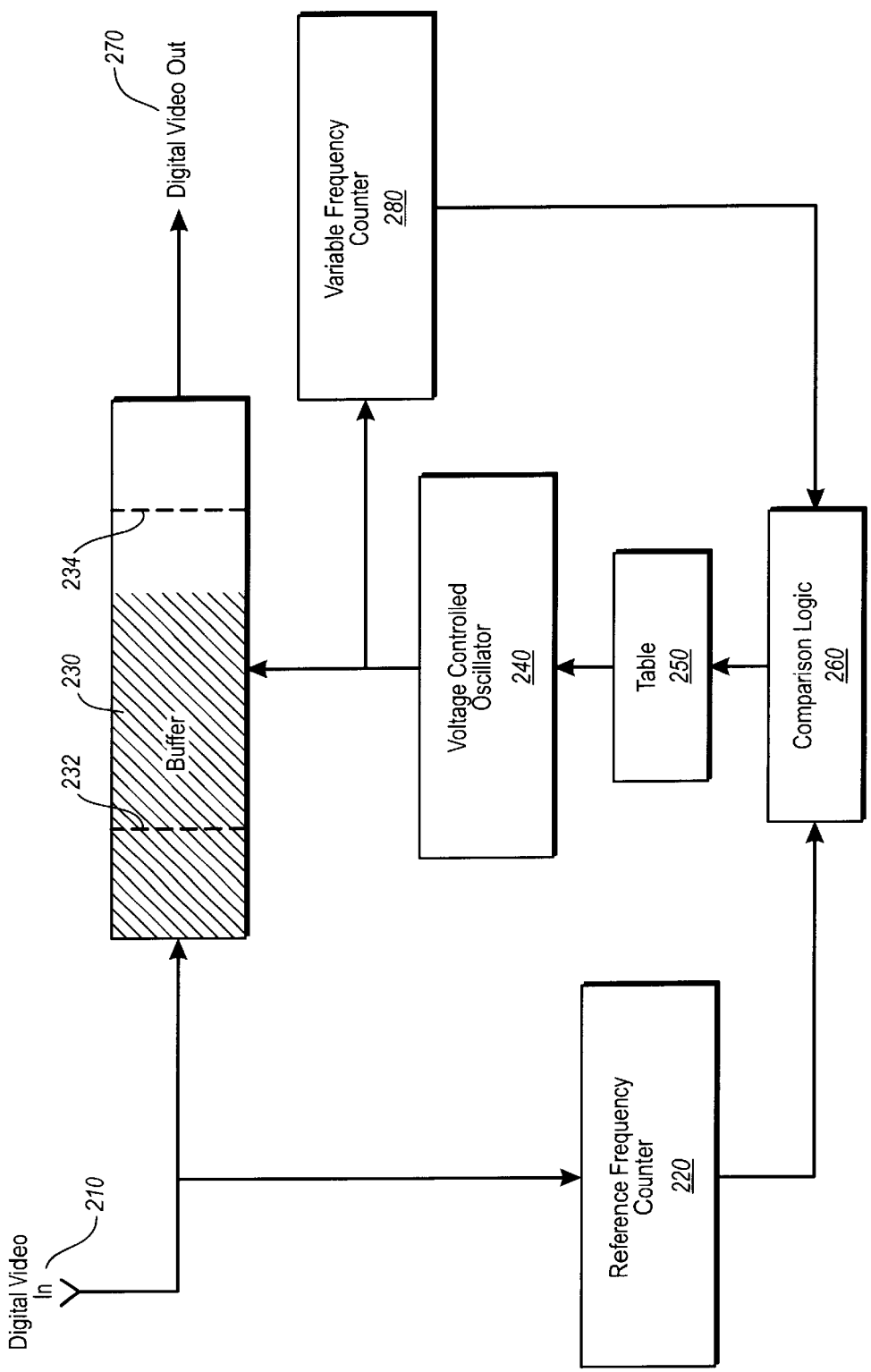
FIG. 2 shows the voltage controlled oscillator of FIG. 1 in the context of a system that processes a digital video signal.

Other voltages producing frequencies higher than the nominal frequency and frequencies lower than the nominal frequency also may be stored in table 150. For example, one application may use frequencies up to 10% greater than and down to 10% less than the nominal frequency. Storing the corresponding voltages in table 150 makes table 150 a discrete representation of at least a portion of the voltage-to-frequency transfer function of voltage controlled oscillator 140. The present invention does not require any particular number of entries in table 150, but those of skill in the art will recognize that with a larger number of entries, smaller changes in variable frequency 170 may be produced or the voltage needed to produce a frequency between table entries can be determined more accurately. Furthermore, it is not necessary to use table entries directly. For example, it may be desirable to interpolate between table entries to produce intermediate values that are not stored in the table. Other calculations suitable for estimating values are also within the scope of the present invention, including those based on statistical or other analysis. Table 150 and the corresponding memory is one example of storage means for storing a table of one or more control input voltages and a frequency corresponding to each of one or more input voltages. The memory storing table 150 may be any type of volatile or non-volatile memory FIG. 2 shows the voltage controlled oscillator of FIG. 1 in the context of a system that processes a digital video signal. The reference signal is digital video 210. Reference frequency counter 220 counts the frequency of this reference signal. As noted above, frames of digital video 210 typically are placed in a buffer 230 of some sort prior to being displayed. If the rate that frames are removed from buffer 230 does not match the rate that frames are added to buffer 230, either a buffer overflow or buffer underflow will occur. The reference frequency count in reference frequency counter 220 corresponds to the rate that frames are added to buffer 230.

At any instant of time, however, the add rate and the remove rate are likely to differ by some small amount. Because the add rate is fixed based on the received digital signal, the remove rate may need to be adjusted periodically. For example, if the data in buffer 230 reaches underflow threshold 232, the remove rate is decreased to prevent a buffer underflow. Likewise, if the data in buffer 230 reaches overflow threshold 234, the remove rate is increased to prevent a buffer overflow. Underflow threshold 232 and overflow threshold 234 are merely one example of many possible criteria for preventing a buffer underflow or overflow. Adjustments to the remove rate should be slight because the color component of a digital video signal may be lost if the remove rate varies by more than a relatively small amount. For example, the color component in an NTSC signal is approximately 3.58 MHz. If that frequency varies by more than about 100 Hz, the color signal is ignored and the video displays in black and white. As a result, it is important that the magnitude of the remove rate closely match the magnitude of the add rate to prevent loss of color information. Furthermore, slight changes to the remove rate may occur over a time period of multiple seconds to assure that color information is not lost. Buffer 230 is one example of buffering means for temporarily storing data. Buffer 230 may be any type of volatile or non-volatile memory.

Voltage controlled oscillator 240 controls the remove rate. Similar to the description of FIG. 1, above, variable frequency counter 280 counts the digital video output rate 270 (i.e., the remove rate for buffer 230) produced by voltage controlled oscillator 240. Comparison logic 260 compares the add rate to the remove rate by comparing the variable frequency count in variable frequency counter 280 to the reference frequency count in reference frequency counter 220 to calculate the remove rate for one or more control input voltages, including the nominal frequency for the voltage controlled oscillator. Table 250 stores the resulting voltage-to-frequency transfer function.

Using the dynamically determined voltages in table 250 to control the remove rate assures a highly accurate frequency, even if voltage controlled oscillator 240 is a relatively inexpensive oscillator with relatively generous tolerances. Specifically, and according to the present invention, reference frequency counter 220 and variable frequency counter 280 are used to compensate for errors in voltage controlled oscillator 240 due to variations in the voltage that produces the nominal frequency and the overall transfer function. Thus, the present invention allows relatively inexpensive oscillators to be used in the context that FIG. 2 illustrates, without compromising the quality of the processed video.

FIGS. 3A–3C illustrate example voltage-to-frequency transfer functions 330A–330C for several voltage controlled oscillators. The transfer functions may be somewhat exaggerated so the difference between them stand out. Often, transfer functions for voltage controlled oscillators are relatively predicable, whereas the specific voltage that produces the nominal frequency is more likely to vary from oscillator to oscillator, even for oscillators with the same operating specifications. In each of FIGS. 3A–3C, the vertical axis 310 represents increasing frequency, from a minimum of Fmin to a maximum of Fmax, and the horizontal axis 320 represent increasing voltage, from a minimum of Vmin to a maximum of Vmax. The nominal frequency of the voltage controlled oscillator, Fnom, is produced by a specific voltage that is labeled Vnom.

In FIG. 3A, a voltage of Vmin 370A produces a frequency of Fmin 360A and a voltage of Vmax 390A produces a frequency of Fmax 340A. The nominal frequency Fnom 350A is produced by a specific voltage of Vnom 380A. For convenience, the nominal frequency and specific voltage for transfer function 330A are designated by zero point 332A. Even for voltage controlled oscillators with similar transfer functions and/or operating specifications, the zero point 332A is likely to vary from one voltage controlled oscillator to another.

For example, FIG. 3B illustrates a voltage controlled oscillator with a transfer function 330B that is similar to transfer function 330A of FIG. 3A. Voltages from Vmin 370B to Vmax 390B produce frequencies from Fmin 360B to Fmax 340B. However, the zero point 332B, corresponding to Vnom 380B and Fnom 350B, differs from zero point 332A, as is typical of voltage controlled oscillators having the same operating specifications. Although the difference in zero point may be somewhat exaggerated in FIG. 3B so that it stands out, some variation in zero point is normal and expected. For this reason, operating specifications often include a stated nominal value and tolerances expressing a range of variation for the stated nominal value. Voltage controlled oscillators with narrow or strict tolerances are available, but are significantly more expensive than voltage controlled oscillators with generous tolerances, especially as the range of acceptable tolerances decreases.

FIG. 3C shows a voltage controlled oscillator with a different transfer function 330C from that illustrated in FIGS. 3A and 3B. Voltages from Vmin 370C to Vmax 390C produce frequencies from Fmin 360C to Fmax 340C. Here too, the zero point 332C, corresponding to Vnom 380C and Fnom 350C, differs from zero point 332A. The present invention may account for both variations by (i) determining the zero point for a voltage controlled oscillator, (ii) determining one or more voltages that produce frequencies less than the nominal frequency, and (iii) determining one or more voltages that produce frequencies greater than the nominal frequency. The voltages are stored in a table that controls the voltage controlled oscillator so that a relatively inexpensive and imprecise voltage controlled oscillator may provide highly accurate frequencies.

Figure 4A:
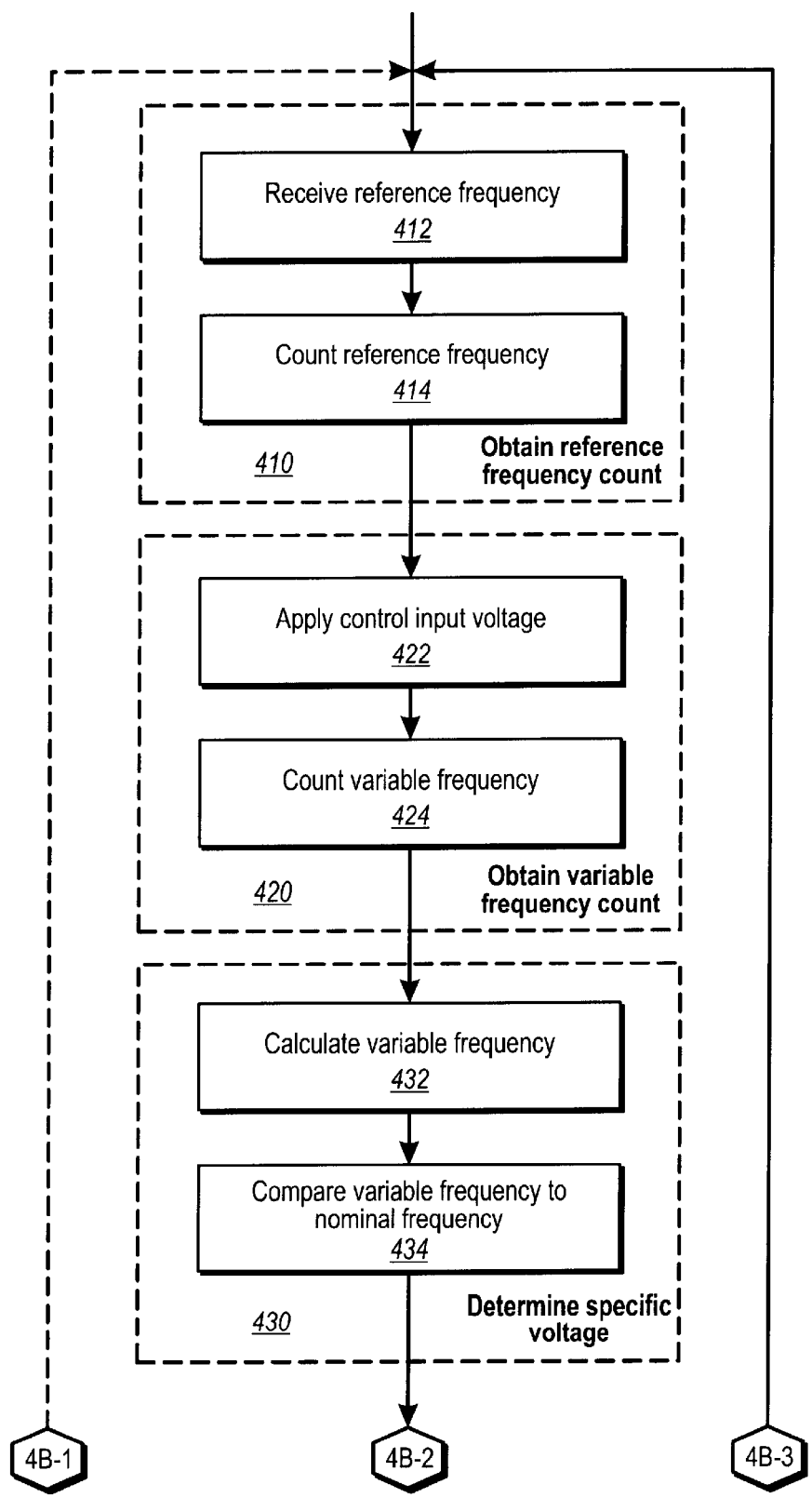
FIGS. 4A–4B are flow diagrams of a method that includes functional steps and/or non-functional acts in accordance with the present invention.
Figure 4B:
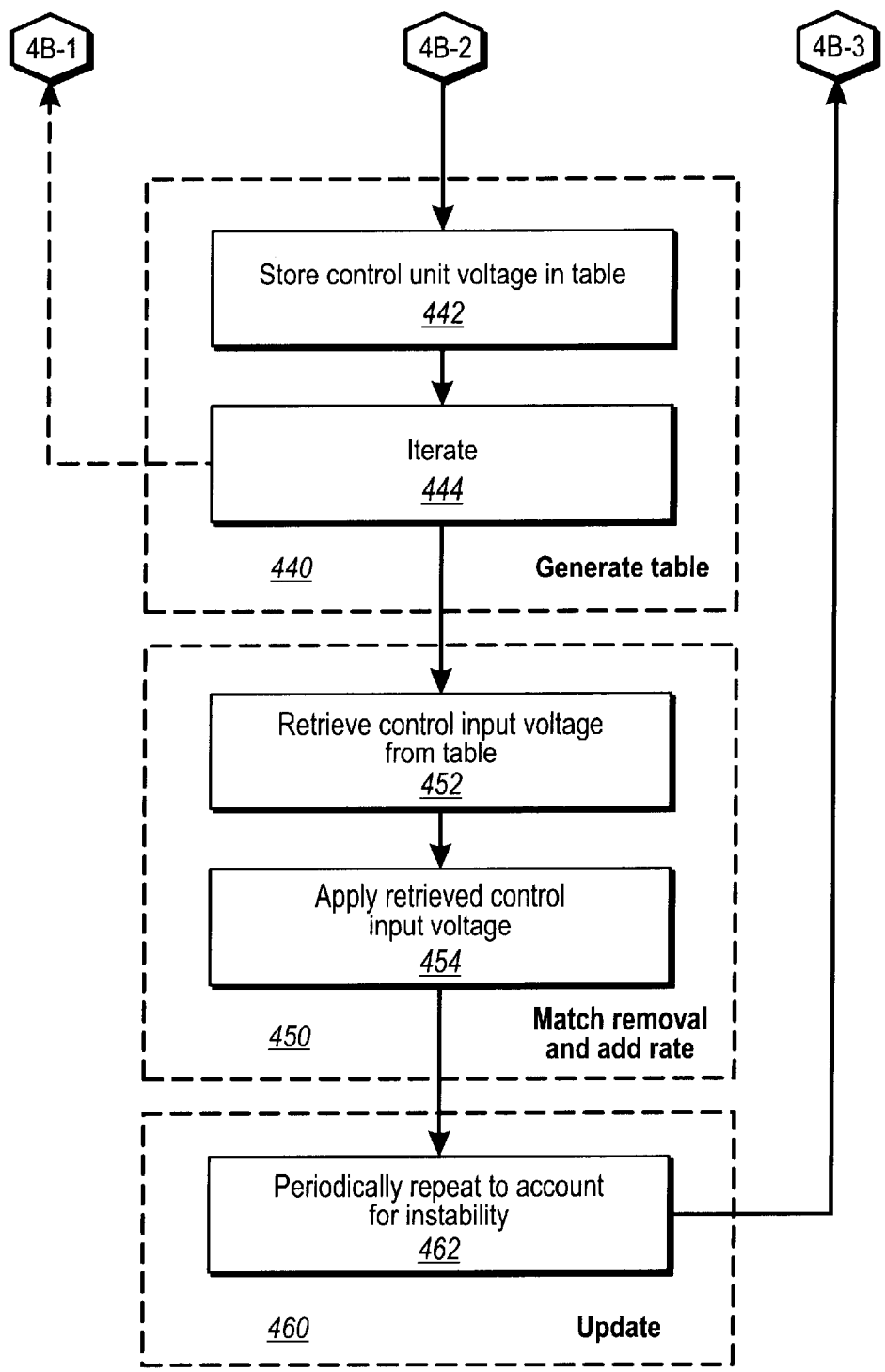

The present invention also may be described in terms of methods comprising functional steps and/or non-functional acts. The following is a description of acts and steps that may be performed in practicing the present invention, correspond to FIGS. 4A–4B. Usually, functional steps describe the invention from a perspective of results that are accomplished, whereas non-functional acts describe more specific actions for achieving a particular result. In some circumstances, several acts may be combined to achieve the results of a particular step. Although the functional steps and non-functional acts may be described or claimed in a particular order, the present invention is not necessarily limited to any particular ordering of the acts and/or steps.

A step for obtaining (410) a reference frequency count may include an act of receiving (412) a reference frequency and an act of counting (414) the reference frequency over a first time interval. The present invention is not limited with respect to the source of the reference frequency. For example, the reference frequency may comprise a portion of a broadcast signal received from a satellite or some other source, a reference oscillator signal, or a signal received over a computer network.

A step for obtaining (420) a variable frequency count from a selected voltage controlled oscillator may include an act of applying (422) a specific one of one more control input voltages to the selected voltage controlled oscillator and an act of counting (424) a variable frequency produced by the selected voltage controlled oscillator in response to the specific one of the one or more control input voltages, wherein the counting occurs over a second time interval. Depending on the implementation, the first and second time intervals may be the same time interval or different time intervals.

A step for determining (430) if a specific one of the one or more control input voltages produces a nominal output frequency may includes an act of calculating (432) the variable frequency from the reference frequency count, the variable frequency count, the time intervals, and the reference frequency, and an act of comparing (434) the variable frequency to the nominal frequency to determine if the specific one of the one or more control input voltages produces the nominal output frequency.

A step for generating (440) a table that represents at least a portion of a voltage-to-frequency transfer function of the selected voltage controlled oscillator may include an act of storing (442) one or more control input voltages in the table and an act of iteratively applying (444) one or more control input voltage to the selected voltage controlled oscillator to produce one or more frequencies that are higher than the nominal frequency and to produce one or more frequencies that are lower than the nominal frequency. A step for determining or deriving an intermediate control input voltage from entries in the table may include an act of interpolating between values or any other act of calculation suitable for approximating values, including calculations based on statistical or other analysis.

A step for matching (450) the remove rate to the add rate so as to avoid a buffer overflow or a buffer underflow may include an act of retrieving (454) at least one of (i) a control input voltage that produces frequencies greater than the nominal frequency, and (ii) a control input voltage that produces frequencies less than the nominal frequency, and an act of applying (454) the retrieved control input voltage to the selected voltage controlled oscillator.

A step for updating (460) the table to account for instability, including drift, may include an act of periodically repeating (462) the iterative application of one or more control input voltages to the selected voltage controlled oscillator and storing (as in 442) the new control input voltages in the table. As used in this application, periodically should be interpreted broadly to include regular and irregular time periods, which may be further subject to or dependent upon external events.

In this manner, the principles of the present invention allow for using a relatively inexpensive voltage controlled oscillator to provide one or more precise and accurate frequencies. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. In a system that requires at least one voltage controlled oscillator having (I) a nominal frequency that is produced in response to a given voltage and (ii) a corresponding voltage-to-frequency transfer function, a method of dynamically calibrating the at least one voltage controlled oscillator during initialization or at one or more subsequent times to compensate for variation, from one voltage controlled oscillator to another, in the given voltage that produces the nominal frequency, the corresponding voltage-to-frequency transfer function, or both, the method comprising:

an act of counting a reference frequency over a one or more first time intervals;

an act of iteratively applying a plurality of control input voltages to said least one voltage controlled oscillator;

an act of counting a variable frequency produced by said at least one voltage controlled oscillator in response to each of the control input voltages, wherein the counting occurs over one or more second time intervals;

an act of calculating the variable frequency produced in response to each of control input voltages based on the reference frequency count, the variable frequency count, the one or more first and second time intervals, and the reference frequency;

an act of comparing each variable frequency, produced in response to the control input voltages, to the nominal frequency to determine a specific one of the control input voltages that produces a nominal output frequency for the selected voltage controlled oscillator;

a step for storing the control input voltages in a table that represents at least a portion of voltage-to-frequency transfer function of said at least one voltage controlled oscillator, wherein the specific one of the control input voltages that produces the nominal output frequency is stored as a zero point in the table; and a step for using the stored transfer function to calibrate the output of said at least one voltage controlled oscillator one or more times.

2. A method as recited in claim 1, further comprising acts of:

an act of retrieving at least two entries from a table, wherein each of the at least two entries includes a control input voltage and a corresponding frequency;

an act of interpolating between the at least two entries to derive an intermediate control input voltage; and an act of applying the intermediate control input voltage to the selected voltage controlled oscillator.

3. A method as recited in claim 1, further comprising an act of, for each of one or more of the plurality of control input voltages that produces a frequency greater than the nominal output frequency, storing the corresponding control input voltage in a portion of the table that identifies one or more control input voltages producing frequencies greater than the nominal output frequency.

4. A method as recited in claim 3, further comprising acts of:

retrieving a control input voltage from the portion of the table that identifies one or more control input voltages producing frequencies greater than the nominal output frequency; and applying the retrieved control input voltage to the selected voltage controlled oscillator.

5. A method as recited in claim 4, wherein the selected voltage controlled oscillator is connected to a buffer containing data which is added at an add rate and removed at a remove rate, the remove rate being controlled by the selected voltage controlled oscillator, and wherein the remove rate is less than the add rate such that an amount of data in the buffer exceeds an overflow threshold.

6. A method as recited in claim 5, wherein the data comprises at least one of audio data and video data.

7. A method as recited in claim 1, further comprising an act of, for each of one or more of the plurality of control input voltages that produces a frequency less than the nominal output frequency, storing the corresponding control input voltage in a portion of the table that identifies one or more control input voltages producing frequencies less than the nominal output frequency.

8. A method as recited in claim 7, further comprising acts of:

retrieving a control input voltage from the portion of the table that identifies one or more control input voltages producing frequencies less than the nominal output frequency; and applying the retrieved control input voltage to the selected voltage controlled oscillator.

9. A method as recited in claim 8, wherein the selected voltage controlled oscillator is connected to a buffer containing data which is added at an add rate and removed at a remove rate, the remove rate being controlled by the selected voltage controlled oscillator, and wherein the remove rate is greater than the add rate such that an amount of data in the buffer drops below an underflow threshold.

10. A method as recited in claim 9, wherein the data comprises an MPEG video stream.

11. A method as recited in claim 1, further comprising an act of periodically repeating the iterative application of the plurality of control input voltages to the selected voltage controlled oscillator to account for instability, including drift, in the particular control input voltage that produces the nominal output frequency.

12. A method as recited in claim 1, further comprising an act of receiving the reference frequency, wherein the reference frequency comprises at least one of (i) a portion of a broadcast signal received from a satellite, (ii) a reference oscillator signal, and (iii) a signal received over a computer network.

13. A method as recited in claim 1, wherein the first time interval is equal to the second time interval.

14. In a system that requires at least one voltage controlled oscillator having (i) a nominal frequency that is produced in response to a given voltage and (ii) a corresponding voltage-to-frequency transfer function, a method of dynamically calibrating the at least one voltage controlled oscillator during initialization or at one or more subsequent times to compensate for variation, from one voltage controlled oscillator to another, in the given voltage that produces the nominal frequency, the corresponding voltage-to-frequency transfer function, or both, the method comprising:

a step for obtaining one or more reference frequency counts;

a step for obtaining a plurality of variable frequency counts from a said at least one voltage controlled oscillator that produces a variable frequency in response to more a plurality or control input voltages;

a step for, based on the one or more reference frequency counts and the variable frequency count, determining a specific one of the control input voltages that produces a nominal output frequency for said at least one voltage controlled oscillator;

a step for, based on the iteratively obtained variable frequency counts, generating a table that represents at least a portion of a voltage-to-frequency transfer function of said at least one voltage controlled oscillator, wherein the specific one of the control input voltages that produces a nominal output frequency represents a zero point in the table; and a step for using the stored transfer function to calibrate the output of said at least one voltage controlled oscillator one or more times.

15. A method as recited in claim 14, wherein the step for generating a table comprises acts of:

for each of one or more of the plurality of control input voltages that produces a frequency greater than the nominal output frequency, storing the corresponding control input voltage in a portion of the table that identifies one or more control input voltages producing frequencies greater than the nominal output frequency; and for each of one or more of the plurality of control input voltages that produces a frequency less than the nominal output frequency, storing the corresponding control input voltage in a portion of the table that identifies one or more control input voltages producing frequencies less than the nominal output frequency.

16. A method as recited in claim 15, further comprising acts of:

retrieving at least one of (i) a control input voltage from the portion of the table that identifies one or more control input voltages producing frequencies greater than the nominal output frequency, and (ii) a control input voltage from the portion or the table that identifies one or more control input voltages producing frequencies less than the nominal output frequency; and applying the retrieved control input voltage to the selected voltage controlled oscillator.

17. A method as recited in claim 15, further comprising:

an act of retrieving at least two entries from the table, wherein each of the at least two entries includes a control input voltage and a corresponding frequency;

a step for deriving an intermediate control input voltage from the at least two entries; and an act of applying the intermediate control input voltage to the selected voltage controlled oscillator.

18. A method as recited in claim 17, wherein the step for deriving the intermediate control input voltage comprises an act of interpolating between the at least two entries.

19. A method as recited in claim 15, wherein the selected voltage controlled oscillator is connected to a buffer containing data which is added at an add rate and removed at a remove rate, the remove rate being controlled by the selected voltage controlled oscillator, the method further comprising a step for continuously matching the remove rate to the add rate so as to avoid a buffer overflow or a buffer underflow.

20. A method as recited in claim 19, wherein the data comprises at least one of audio data and video data.

21. A method as recited in claim 19, wherein the data comprises an MPEG video stream.

22. A method as recited in claim 14, further comprising a step for periodically updating the table to account for instability, including drift, in a control input voltage that produces the nominal output frequency.

23. In a system that includes at least one voltage controlled oscillator having (i) a nominal frequency that is produced in response to a given voltage and (ii) a corresponding voltage-to-frequency transfer function, a method of calibrating the at least one voltage controlled oscillator to compensate for variation, from one voltage controlled oscillator to another, in the given voltage that produces the nominal frequency, the corresponding voltage-to-frequency transfer function, or both, even though the given voltage that produces the nominal frequency and the corresponding voltage-to-frequency transfer function for the at least one voltage controlled oscillator are within specified tolerances, the method comprising steps for:

obtaining a reference frequency count;

iteratively obtaining a plurality of variable frequency counts corresponding to a plurality of control input voltages;

generating a table based on the iteratively obtained variable frequency counts, wherein the table represents at least a portion of a voltage-to-frequency transfer function of the selected voltage controlled oscillator;

for each of one or more of the plurality of control input voltages that produces a frequency greater than the nominal output frequency, storing the corresponding control input voltage in a portion of the table that identifies one or more control input voltages producing frequencies greater than the nominal output frequency;

for each of one or more of the plurality of control input voltages that produces a frequency less than the nominal output frequency, storing the corresponding control input voltage in a portion of the table that identifies one or more control input voltages producing frequencies less than the nominal output frequency;

retrieving at least two entries from the table, wherein each of the at least two entries includes a control input voltage and a corresponding frequency;

deriving an intermediate control input voltage from the at least two entries;

applying the intermediate control input voltage to the selected voltage controlled oscillator; and based on the reference frequency count and the variable frequency count, determining if a specific one of the one or more control input voltages produces a nominal output frequency for the selected voltage controlled oscillator.

24. A method as recited in claim 23, further comprising acts of:

retrieving at least one of (i) a control input voltage from the portion of the table that identifies one or more control input voltages producing frequencies greater than the nominal output frequency, and (ii) a control input voltage from the portion of the table that identifies one or more control input voltages producing frequencies less than the nominal output frequency; and applying the retrieved control input voltage to the selected voltage controlled oscillator.

25. A method as recited in claim 23, wherein the step for deriving the intermediate control input voltage comprises an act of interpolating between the at least two entries.

26. A method as recited in claim 23, wherein the selected voltage controlled oscillator is connected to a buffer containing data which is added at an add rate and removed at a remove rate, the remove rate being controlled by the selected voltage controlled oscillator, the method further comprising a step for continuously matching the remove rate to the add rate so as to avoid a buffer overflow or a buffer underflow.

27. A method as recited in claim 26, wherein the data comprises at least one of audio data and video data.

28. A method as recited in claim 26, wherein the data comprises an MPEG video stream.

29. A method as recited in claim 23, further comprising a step for periodically updating the table to account for instability, including drift, in a control input voltage that produces the nominal output frequency.

30. In a system that includes at least one voltage controlled oscillator having (i) a nominal frequency that is produced in response to a given voltage and (ii) a corresponding voltage to frequency transfer function, a method of calibrating the at least one voltage controlled oscillator to compensate for variation, from one voltage controlled oscillator to another, in the given voltage that produces the nominal frequency, the corresponding voltage to frequency transfer function, or both, even though the given voltage that produces the nominal frequency and the corresponding voltage to frequency transfer function for the at least one voltage controlled oscillator are within specified tolerances, the method comprising acts of:

counting a reference frequency over a first time interval;

applying a specific one of one or more control input voltages to a selected voltage controlled oscillator;

counting a variable frequency produced by the selected voltage controlled oscillator in response to the specific one of the one or more control input voltages, wherein the counting occurs over a second time interval;

calculating the variable frequency from the reference frequency count, the variable frequency count, the first and second time intervals, and the reference frequency;

comparing the variable frequency to the nominal frequency to determine if the specific one of the one or more control input voltages produces a nominal output frequency for the selected voltage controlled oscillator;

retrieving at least two entries from a table, wherein each of the at least two entries includes a control input voltage and a corresponding frequency;

interpolating between the at least two entries to derive an intermediate control input voltage; and applying the intermediate control input voltage to the selected voltage controlled oscillator.

31. A method as recited in claim 30, further comprising an act of periodically repeating the iterative application of the plurality of control input voltages to the selected voltage controlled oscillator to account for instability, including drift, in the particular control input voltage that produces the nominal output frequency.

32. A method as recited in claim 30, further comprising an act of receiving the reference frequency, wherein the reference frequency comprises at least one of (i) a portion of a broadcast signal received from a satellite, (ii) a reference oscillator signal, and (iii) a signal received over a computer network.

33. A method as recited in claim 30, wherein the first time interval is equal to the second time interval.

* * * * *

UNITED STATES PATENT AND TRADEMARK OFFICE
CERTIFICATE OF CORRECTION

PATENT NO. : 6,606,003 B2
DATED : August 12, 2003
INVENTOR(S) : David G. Conroy

It is certified that error appears in the above-identified patent and that said Letters Patent is hereby corrected as shown below:

<u>Column 2,</u>
Line 9, after "produces the" please delete "nomial" and insert -- nominal --
Line 11, after "the present" please delete "invenntion" and insert -- invention --

<u>Column 7,</u>
Line 21, after "frequency may" please delete "includes" and insert -- include --

<u>Column 8,</u>
Line 8, after "oscillator having" please delete "(I)" and insert -- (i) --
Line 17, after "frequency over" please delete "a"

Signed and Sealed this

Twenty-fifth Day of May, 2004

JON W. DUDAS
*Acting Director of the United States Patent and Trademark Office*